United States Patent
Wu

(10) Patent No.: US 12,155,016 B2
(45) Date of Patent: Nov. 26, 2024

(54) FLEXIBLE COLOR FILTER AND MANUFACTURING METHOD THEREOF, FULL-COLOR MICRO LIGHT-EMITTING DIODE DEVICE

(71) Applicant: TCL China Star Optoelectronics Technology Co., Ltd., Shenzhen (CN)

(72) Inventor: Linglian Wu, Shenzhen (CN)

(73) Assignee: TCL China Star Optoelectronics Technology Co., Ltd., Shenzhen (CN)

( * ) Notice: Subject to any disclaimer, the term of this patent is extended or adjusted under 35 U.S.C. 154(b) by 1079 days.

(21) Appl. No.: 16/960,559

(22) PCT Filed: Jun. 2, 2020

(86) PCT No.: PCT/CN2020/093986
§ 371 (c)(1),
(2) Date: Jul. 8, 2020

(87) PCT Pub. No.: WO2021/232493
PCT Pub. Date: Nov. 25, 2021

(65) Prior Publication Data
US 2023/0102912 A1 Mar. 30, 2023

(30) Foreign Application Priority Data
May 19, 2020 (CN) .......................... 202010426202.8

(51) Int. Cl.
*H01L 33/50* (2010.01)
*H01L 33/00* (2010.01)
*H01L 33/10* (2010.01)

(52) U.S. Cl.
CPC .......... *H01L 33/505* (2013.01); *H01L 33/005* (2013.01); *H01L 33/10* (2013.01); *H01L 2933/0041* (2013.01)

(58) Field of Classification Search
CPC ...................................................... H01L 33/505
USPC ............................................................ 257/89
See application file for complete search history.

(56) References Cited

U.S. PATENT DOCUMENTS

2007/0147760 A1* 6/2007 Iimura ................. G02B 6/0061
385/129
2019/0101690 A1* 4/2019 Wang ................... G02B 6/0038
2020/0105988 A1* 4/2020 Hashimoto ........... H01L 33/505

FOREIGN PATENT DOCUMENTS

| CN | 103278961 | A | | 9/2013 |
| CN | 203631145 | U | * | 6/2014 |
| CN | 105301836 | A | | 2/2016 |
| CN | 106353923 | A | | 1/2017 |
| CN | 106773306 | A | | 5/2017 |

(Continued)

OTHER PUBLICATIONS

Machine translation of Li et al. CN 109979960, Jul. 5, 2019 (Year: 2019).*

(Continued)

*Primary Examiner* — Hsin Yi Hsieh
(74) *Attorney, Agent, or Firm* — Nathan & Associates; Menachem Nathan

(57) ABSTRACT

A flexible color filter, a method of manufacturing thereof, and a full-color micro light-emitting diode device are provided. The full-color micro light-emitting diode device includes a flexible color filter. The flexible color filter includes a polymer resin substrate, a reflective layer, a light diffusion layer, and a quantum dot layer.

13 Claims, 2 Drawing Sheets

(56) References Cited

FOREIGN PATENT DOCUMENTS

| | | | |
|---|---|---|---|
| CN | 107577084 A | | 1/2018 |
| CN | 108447965 A | | 8/2018 |
| CN | 108761894 A | | 11/2018 |
| CN | 109004094 A | | 12/2018 |
| CN | 109216396 A | | 1/2019 |
| CN | 109979960 A | * | 7/2019 |
| CN | 110047986 A | | 7/2019 |
| CN | 209102941 U | | 7/2019 |
| CN | 110246990 A | | 9/2019 |
| CN | 209433056 U | | 9/2019 |
| CN | 110911456 A | | 3/2020 |
| CN | 210294747 U | | 4/2020 |
| WO | 2019099833 A1 | | 5/2019 |

OTHER PUBLICATIONS

Machine translation of Gong et al. CN 203631145, Jun. 4, 2014 (Year: 2014).*

* cited by examiner

FLEXIBLE COLOR FILTER AND MANUFACTURING METHOD THEREOF, FULL-COLOR MICRO LIGHT-EMITTING DIODE DEVICE

BACKGROUND OF INVENTION

Field of Invention

The present disclosure relates to the technical field of mobile communications, and more particularly, to the technical field of mobile devices, and specifically, to a flexible color filter and a manufacturing method thereof, and a full-color micro light-emitting diode device.

Description of Prior Art

Quantum dot display technology has fully upgraded the conventional display technology in various dimensions, such as color gamut coverage, color control accuracy, red, green, and blue color purity, etc., which is regarded as the commanding height of global display technology and is also regarded as a display technology revolution affecting the world.

However, there are still many technical problems, such as full-color technology. Full-color solutions are divided into two categories, one is three primary colors light-emitting chips of red, green, and blue (RGB), and the other is a monochromatic chip with a color conversion layer. Although the former technology is relatively mature at present, there is still more difficulty in process. This solution also needs to involve the more difficult problem of massive transfer of chips; therefore the latter is more optimistic for the full-color technology now.

However, the light output ratio of the quantum dot of the conventional monochromatic chip with the color conversion layer technology is very low.

Technical Problem

The present disclosure provides a flexible color filter film and a manufacturing method thereof, and a full-color micro light-emitting diode device, which can solve the technical problem that the light output ratio of the quantum dot of the conventional monochrome chip with the color conversion layer technology is very low.

SUMMARY OF INVENTION

The present disclosure provides a flexible color filter, which comprises a polymer resin substrate, a reflective layer, a light diffusion layer, and a quantum dot layer. A plurality of receiving grooves arranged at intervals are disposed on a bottom of the polymer resin substrate. Adjacent three of the receiving grooves are respectively a red light groove, a green light groove, and a blue light groove. The reflective layer is disposed on the bottom of the red light groove and the bottom of the green light groove. The light diffusion layer is disposed on an inner side wall of each of the receiving grooves. The quantum dot layer comprises a green light quantum dot layer and a red light quantum dot layer. The green light quantum dot layer is disposed on the reflective layer inside the green light groove, and the red light quantum dot layer is disposed on the reflective layer inside the red light groove.

In use, a blue light emitted by a blue light source is incident from a notch of the receiving groove. The blue light directly passes through a position of the blue light groove, and the blue light passes through the green light quantum dot layer in the green light groove to the reflective layer. The blue light in the reflective layer is refracted and reflected back to the quantum dot layer. The quantum dot layer absorbs the blue light and emits fluorescence, and part of the fluorescence emitted to the surroundings is scattered by the light diffusion layer for enhancing the absorption of the blue light to increase the utilization rate of the blue light and the light output ratio of the quantum dot layer.

Further, the polymer resin substrate is formed by curing one material of polydimethylsiloxane, silicone or resin.

Further, the receiving grooves are formed by nano-imprinting or etching the polymer resin substrate.

Further, the reflective layer comprises a distributed Bragg reflector.

Further, a thickness and a material of the reflective layer disposed in the green light groove are different from a thickness a material of the reflective layer disposed in the red light groove.

Further, the light diffusion layer is formed by mixing and curing a light diffusion powder and a matrix adhesive.

Further, a weight proportion of the light diffusion powder within the light diffusion layer is 5%-20%.

Further, the light diffusion powder comprises an organic material and an inorganic material. The organic material comprises one or more of acrylate (PMMA), polystyrene (PS), organic silicone microspheres, and silicon microspheres. The inorganic material comprises one or more of nano-aluminium oxide, nanosilver, and nanogold. The matrix adhesive is formed by mixing one or more materials of acrylate adhesive, polyurethane adhesive, and epoxy resin adhesive.

Further, the green light quantum dot layer comprises green light quantum dots, and the red light quantum dot layer comprises red light quantum dots. The red light quantum dot material and the green light quantum dot material are composed of a mixture of one of a quantum dot solution, a quantum dot powder, or a quantum dot-polymer powder.

The present disclosure further provides a method of manufacturing the flexible color filter described above, comprises steps of:

depositing a liquid polymer resin on a substrate to form a polymer resin base after thermal curing or ultraviolet curing, followed by forming a plurality of receiving grooves arranged at intervals by nano-imprinting or etching the polymer resin substrate; wherein adjacent three of the receiving grooves are respectively a red light groove, a green light groove, and a blue light groove;

disposing a reflective layer on a bottom of the red light groove and a bottom of the green light groove;

coating a mixture of a light diffusion powder and a matrix adhesive on an inner side wall of each of the receiving grooves to form a light diffusion layer by thermal curing; and filling the green light groove and the red light groove respectively with a green light quantum dot material and a red light quantum dot material by inkjet printing or atomizing spraying on the light diffusion layer, to obtain an quantum dot layer after curing.

The present disclosure further provides a full-color micro light-emitting diode device. The full-color micro light-emitting diode device comprises the flexible color filter described above.

Further, the full-color micro light-emitting diode device further comprises a blue light back plate attached to one side of the flexible color filter disposed with the receiving groove. A plurality of blue light sources arranged at intervals are disposed on the blue light back plate. Each of the blue light sources is respectively disposed corresponding to each of the receiving grooves, and each of the blue light sources is respectively disposed at a notch position of each of the receiving grooves.

Beneficial Effect

The beneficial effect of the present disclosure is to provide a flexible color filter and a manufacturing method thereof, and a full-color micro light-emitting diode device. The absorption of the blue light by the quantum dot layer is enhanced by disposing the reflective layer and the light diffusion layer, thereby increasing the utilization rate of the blue light and the light output ratio of the quantum dot layer. The quantum dot layer is disposed on a single short-wavelength micro-LED array to convert the light emitted by the chip into red, green, and blue (RGB) colors to achieve full color display. The absorption of blue light by the quantum dot layer is not less than 2, thereby ensuring that the blue light is fully absorbed by the quantum dots by not less than 99%. This can not only ensure the full utilization of blue light, improve energy utilization, but also ensure that the color gamut and color purity of the display are high enough to achieve high-quality pictures.

BRIEF DESCRIPTION OF DRAWINGS

The technical solutions and other beneficial effects of the present disclosure will be apparent through the detailed description of the specific embodiments of the present disclosure in combined with the accompanying drawings.

DETAILED DESCRIPTION OF PREFERRED EMBODIMENTS

The technical solutions in the embodiments of the present disclosure will be described clearly and completely in combined with the drawings shown in the embodiments of the present disclosure. Obviously, the described embodiments are only one part of the embodiments of the present disclosure, but not all of the embodiments. Based on the embodiments of the present disclosure, all other embodiments obtained by a person skilled in the art without making creative efforts fall within the claim scope of the present disclosure.

In the description of the present disclosure, it should be noted that, unless otherwise clearly specified and limited, the terms, such as the terms "disposed", "connected", and "connection" should be understood in a broad sense. For example, it may be a fixed connection, a detachable connection, or an integral connection. It may be a mechanical connection, an electrical connection, or can communicate with each other. It may be directly connected or indirectly connected through an intermediary. It may be the communication between two elements or the interaction between two elements. A person ordinarily skilled in the art may understand the specific meanings of the terms described above in the present disclosure according to specific situations.

In the present disclosure, unless otherwise clearly specified and limited, the first feature "above" or "below" the second feature may include the direct contact of the first and second features, or may also include the first and second features do not contact directly but through another feature between them. Moreover, the first feature is "above", "on" and "upon" the second feature includes that the first feature is directly above and obliquely above the second feature, or simply means that the horizontal height of the first feature is higher than the horizontal height of the second feature. The first feature is "below", "under" and "lower" the second feature includes that the first feature is directly below and obliquely below the second feature, or simply means that the horizontal height of the first feature is lower than the horizontal height of the second feature.

Figure 1:
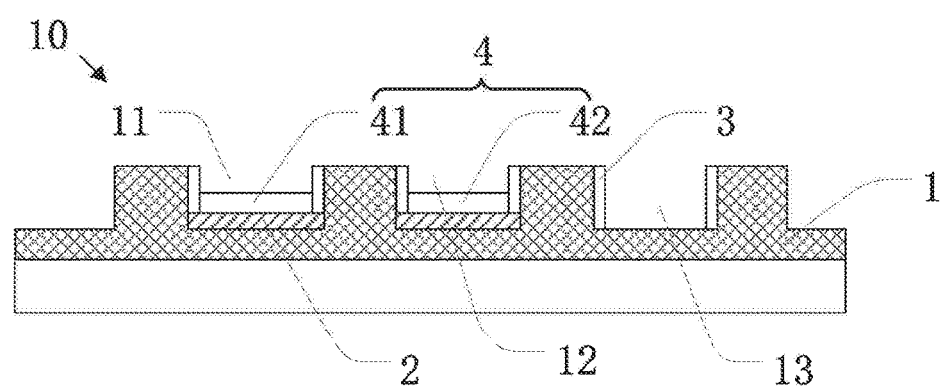
FIG. 1 is a schematic view of the flexible color filter according to one embodiment of the present disclosure.
Figure 3:
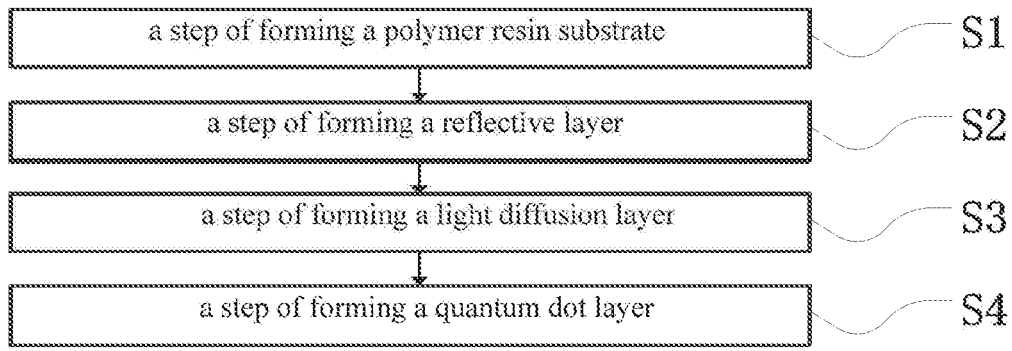
FIG. 3 is a schematic view of the polymer resin substrate according to one embodiment of the present disclosure.

Specifically, as shown in FIG. 1 and FIG. 3, an embodiment of the present disclosure provides a flexible color filter 10. The flexible color filter 10 comprises a polymer resin substrate 1, a reflective layer 2, a light diffusion layer 3, and a quantum dot layer 4. A plurality of receiving grooves arranged at intervals are disposed on the polymer resin substrate 1. Adjacent three of the receiving grooves are respectively a red light groove 11, a green light groove 12, and a blue light groove 13. The reflective layer 2 is disposed on a bottom of the green light groove 12 and a bottom of the red light groove 11. The light diffusion layer 3 is disposed on an inner side wall of each of the receiving grooves 11, 12, 13. The quantum dot layer 4 comprises a red light quantum dot layer 41 and a green light quantum dot layer 42. The red light quantum dot layer 41 is disposed on the reflective layer 2 inside the red light groove 11. The green light quantum dot layer 42 is disposed on the reflective layer 2 inside the green light groove 12.

Figure 4:
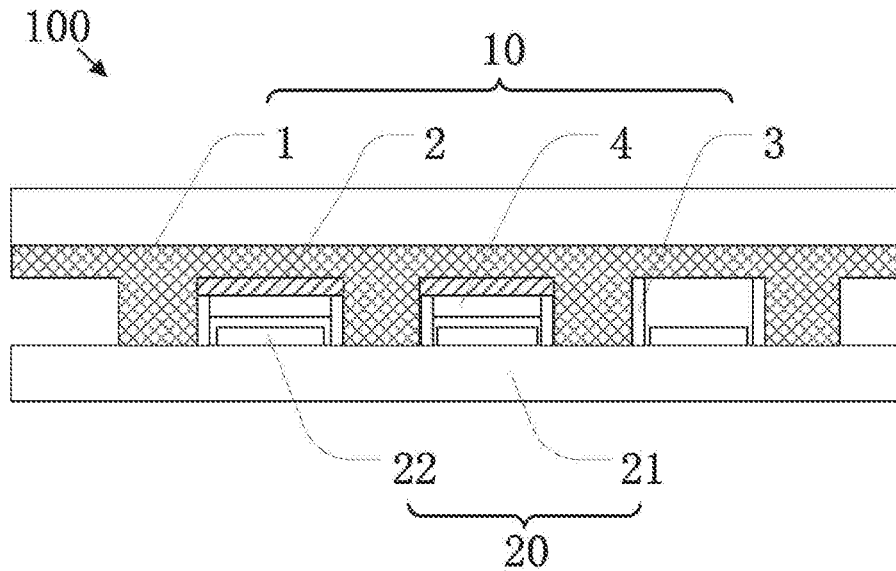
FIG. 4 is a schematic view of the full-color micro light-emitting diode device according to one embodiment of the present disclosure.

In use, as shown in FIG. 4, a blue light emitted by a blue light source 22 is incident from the notches of the receiving grooves 11, 12, 13. The blue light directly passes through a position of the blue light groove 13, and the blue light passes through the red light quantum dot layer 41 and the green light quantum dot layer 42 respectively on the red light groove 11 and the green light groove 12 to the reflective layer 2. The blue light in the reflective layer 2 is refracted and reflected back to the quantum dot layer 4. The quantum dot layer 4 absorbs the blue light and emits fluorescence, and part of the fluorescence emitted to the surroundings is scattered by the light diffusion layer 3. It is used to enhance the absorption of the blue light to increase the utilization rate of the blue light and the light output ratio of the quantum dot layer 4.

In one embodiment of the present disclosure, the quantum dot layer 4 is placed on a blue light source 22 emitting a single short wavelength. The blue light source 22 is a blue light micro-LED array, and the blue light source 22 is preferably a blue light micro-LED chip, thereby converting the blue light emitted by the blue light source 22 into three colors of red, green, and blue (RGB) to achieve the full color display. Preferably, the thickness of the quantum dot layer 4 is 450 nm, which achieves the absorption of blue light by the quantum dot layer 4 being not less than 2, thereby ensuring that the blue light is fully absorbed by the quantum dots by not less than 99%. It may not only ensure the full utilization of the blue light and increase utilization rate of energy, but also ensure that the color gamut and color purity of the display are high enough to achieve high-quality pictures.

In one embodiment of the present disclosure, the polymer resin substrate 1 is formed by curing one material of polydimethylsiloxane, silicone or resin. The polymer resin substrate 1 is light transparent and has flexibility, which is convenient for bending.

In one embodiment of the present disclosure, the receiving grooves 11, 12, 13 are formed by nano-imprinting or etching the polymer resin substrate 1.

In one embodiment of the present disclosure, the reflective layer 2 comprises a distributed Bragg reflector (DBR). By disposing and forming the reflective layer 2, the blue light emitted from the monochromatic blue light micro light-emitting diode may be inhibited. The reflective layer 2 has high reflectivity and low transmittance to the blue light. The reflective layer 2 has low reflectivity and high transmittance to the red light and the green light.

In one embodiment of the present disclosure, the thickness and the material of the reflective layer 2 disposed on the green light groove 12 are different from the thickness and the material of the reflective layer 2 disposed on the red light groove 11.

In one embodiment of the present disclosure, the light diffusion layer 3 is formed by mixing and curing a light diffusion powder and a matrix adhesive.

In the embodiment of the present disclosure, a weight proportion of the light diffusion powder within the light diffusion layer 3 is 5%-20%.

In one embodiments of the present disclosure, the light diffusion powder comprises an organic material and an inorganic material. The organic material comprises one or more of acrylate (PMMA), polystyrene (PS), organic silicone microspheres, and silicon microspheres. The inorganic material comprises one or more of nano-aluminum oxide, nano-silver, and nano-gold. The matrix adhesive is formed by mixing one or more materials of acrylate adhesive, polyurethane adhesive, and epoxy resin adhesive.

In one embodiment of the present disclosure, the green light quantum dot layer 42 comprises green light quantum dots, and the red light quantum dot layer 41 comprises red light quantum dots. The red light quantum dot material and the green light quantum dot material are composed of a mixture of one of a quantum dot solution, a quantum dot powder, or a quantum dot-polymer powder.

Figure 2:
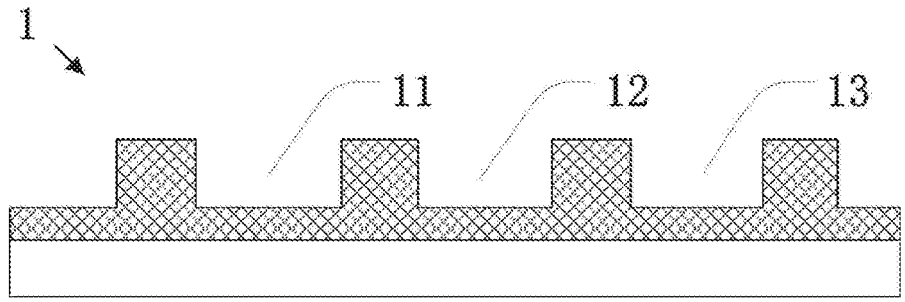
FIG. 2 is a flowchart of a method of manufacturing the flexible color filter according to one embodiment of the present disclosure.

Referring to FIG. 2, the present disclosure also provides a method of manufacturing the flexible color filter 10, which comprises the following steps S1-S4.

Step S1 of forming a polymer resin substrate 1, depositing a liquid polymer resin on a substrate to form the polymer resin base 1 after thermal curing or ultraviolet curing, followed by forming a plurality of receiving grooves arranged at intervals by nano-imprinting or etching the polymer resin substrate 1. Adjacent three of the receiving grooves are respectively a red light groove 11, a green light groove 12, and a blue light groove 13. As shown in FIG. 3, the polymer resin base 1 is formed and the substrate therein is preferably a glass substrate.

Step S2 of forming a reflective layer 2, disposing the reflective layer 2 on a bottom of the red light groove 11 and a bottom of the green light groove 12.

Step S3 of forming a light diffusion layer 3, coating a mixture of a light diffusion powder and a matrix adhesive on an inner side wall of each of the receiving grooves 11, 12, 13 to form the light diffusion layer 3 by thermal curing.

Step S4 of forming a quantum dot layer 4, filling the green light groove 12 and the red light groove 11 respectively with a green light quantum dot material and a red light quantum dot material by inkjet printing or atomizing spraying on the light diffusion layer 3, to obtain the quantum dot layer 4 after curing. The formed flexible color filter 10 is shown in FIG. 1.

In one embodiment of the present disclosure, the polymer resin substrate 1 is formed by curing one of polydimethylsiloxane, silicone, or resin. The polymer resin substrate 1 is light transparent and has flexibility, which is convenient for bending.

In one embodiment of the present disclosure, the receiving grooves 11, 12, 13 are formed by nano-imprinting or etching the polymer resin substrate 1.

In one embodiment of the present disclosure, the reflective layer 2 comprises a distributed Bragg reflector (DBR). By disposing and forming the reflective layer 2, the blue light emitted from the monochromatic blue light micro light-emitting diode may be inhibited. The reflective layer 2 has high reflectivity and low transmittance to the blue light. The reflective layer 2 has low reflectivity and high transmittance to the red light and the green light.

In one embodiment of the present disclosure, the thickness and the material of the reflective layer 2 disposed on the green light groove 12 are different from the thickness and the material of the reflective layer 2 disposed on the red light groove 11.

In one embodiment of the present disclosure, the light diffusion layer 3 is formed by mixing and curing a light diffusion powder and a matrix adhesive.

In the embodiment of the present disclosure, a weight proportion of the light diffusion powder within the light diffusion layer 3 is 5%-20%.

In one embodiments of the present disclosure, the light diffusion powder comprises an organic material and an inorganic material. The organic material comprises one or more of acrylate (PMMA), polystyrene (PS), organic silicone microspheres, and silicon microspheres. The inorganic material comprises one or more of nano-aluminum oxide, nano-silver, and nano-gold. The matrix adhesive is formed by mixing one or more materials of acrylate adhesive, polyurethane adhesive, and epoxy resin adhesive.

In one embodiment of the present disclosure, the green light quantum dot layer 42 comprises green light quantum dots, and the red light quantum dot layer 41 comprises red light quantum dots. The red light quantum dot material and the green light quantum dot material are composed of a mixture of one of a quantum dot solution, a quantum dot powder, or a quantum dot-polymer powder.

When the flexible color filter 10 manufactured by the method of one embodiment of the present disclosure is used, a blue light emitted by a blue light source 22 is incident from the notches of the receiving grooves 11, 12, 13. The blue light directly passes through a position of the blue light groove 13, and the blue light passes through the red light quantum dot layer 41 and the green light quantum dot layer 42 respectively on the red light groove 11 and the green light groove 12 to the reflective layer 2. The blue light in the reflective layer 2 is refracted and reflected back to the quantum dot layer 4. The quantum dot layer 4 absorbs the blue light and emits fluorescence, and part of the fluorescence emitted to the surroundings is scattered by the light diffusion layer 3. It is used to enhance the absorption of the blue light to increase the utilization rate of the blue light and the light output ratio of the quantum dot layer 4.

As shown in FIG. 4, the present disclosure also provides a full-color micro light-emitting diode device 100. The full-color micro light-emitting diode device 100 comprises the flexible color filter 10 described above.

In the embodiment of the present disclosure, the full-color micro light-emitting diode device 100 further comprises a blue light back plate 20 attached to one side of the flexible color filter 10 disposed with the receiving groove 11, 12, 13. A plurality of blue light sources 22 arranged at intervals on a light board 21 are disposed on the blue light back plate 20. Each of the blue light sources 22 is respectively disposed corresponding to each of the receiving grooves 11, 12, 13, and each of the blue light sources 22 is respectively disposed at a notch position of each of the receiving grooves 11, 12, 13.

As using the full-color micro light-emitting diode device 100, as shown in FIG. 4, the blue light emitted by the blue light source 22 is incident from the notches of the receiving grooves 11, 12, 13. The blue light directly passes through a position of the blue light groove 13, and the blue light passes through the green light quantum dot layer 42 in the green light groove 12 to the reflective layer 2. The blue light in the reflective layer 2 is refracted and reflected back to the quantum dot layer 4. The quantum dot layer 4 absorbs the blue light and emits fluorescence, and part of the fluorescence emitted to the surroundings is scattered by the light diffusion layer. It is used to enhance the absorption of the blue light to increase the utilization rate of the blue light and the light output ratio of the quantum dot layer 4.

In one embodiment of the present disclosure, the quantum dot layer 4 is placed on a blue light source 22 emitting a single short wavelength. The blue light source 22 is a blue light micro-LED array, and the blue light source 22 is preferably a blue light micro-LED chip, thereby converting the blue light emitted by the blue light source 22 into three colors of red, green, and blue (RGB) to achieve the full color display. Preferably, the thickness of the quantum dot layer 4 is 450 nm, which achieves the absorption of blue light by the quantum dot layer 4 being not less than 2, thereby ensuring that the blue light is fully absorbed by the quantum dots by not less than 99%. It may not only ensure the full utilization of the blue light and increase utilization rate of energy, but also ensure that the color gamut and color purity of the display are high enough to achieve high-quality pictures.

The beneficial effect of the present disclosure is to provide a flexible color filter and a manufacturing method thereof, and a full-color micro light-emitting diode device. The absorption of the blue light by the quantum dot layer may be enhance by disposing the reflective layer and the light diffusion layer, thereby increasing the utilization rate. The quantum dot layer is placed on a single short-wavelength micro-LED array to convert the light emitted by the chip into red, green, and blue (RGB) colors to achieve the full color display. The absorption of blue light by the quantum dot layer is not less than 2, thereby ensuring that the blue light is fully absorbed by the quantum dots by not less than 99%. It may not only ensure the full utilization of the blue light and increase utilization rate of energy, but also ensure that the color gamut and color purity of the display are high enough to achieve high-quality pictures.

The flexible color filter and the manufacturing method thereof, and the full-color micro light-emitting diode device provided by the embodiments of the present disclosure are described in detail above. The specific examples are used in this article to explain the principles and implementation modes of the present disclosure. The descriptions of the embodiments are only used to help understand the technical solutions and core concept of the present disclosure. A person ordinarily skilled in the art should understand that they can still modify the technical solutions described in the embodiments described above, or make equivalent replacements by modifying some of the technical features; and these modifications or replacements do not deviate the essence of the corresponding technical solutions from the scope of the technical solutions of the embodiments of the present disclosure.

What is claimed is:

1. A color filter, comprising:
   a polymer resin substrate, wherein the polymer resin substrate comprises a top surface and a bottom surface opposite each other in a vertical direction and extending in a horizontal direction perpendicular to the vertical direction, and is disposed with a plurality of receiving grooves recessed with respect to the top surface of polymer resin substrate and arranged at intervals, wherein adjacent three of the receiving grooves are respectively a red light groove, a green light groove, and a blue light groove;
   a reflective layer disposed on a bottom of the red light groove and a bottom of the green light groove;
   a light diffusion layer disposed on an inner side wall of each of the receiving grooves, wherein the light diffusion layer comprises a top surface and a bottom surface opposite each other in the vertical direction and extending in the horizontal direction, and the bottom surface of the light diffusion layer is closer to the reflective layer than the top surface of the light diffusion layer; and
   a quantum dot layer comprising a green light quantum dot layer and a red light quantum dot layer, wherein the green light quantum dot layer is disposed on the reflective layer inside the green light groove and comprises a bottom surface contacting the reflective layer and a top surface opposite the bottom surface of the green light quantum dot layer in the vertical direction, the red light quantum dot layer is disposed on the reflective layer inside the red light groove and comprises a bottom surface contacting the reflective layer and a top surface opposite the bottom surface of the red light quantum dot layer in the vertical direction, and the bottom surfaces and the top surfaces of the green and red light quantum dot layers extend in the horizontal direction,
   wherein the top surface of the green light quantum dot layer is at a level lower than that of the top surface of the light diffusion layer in the vertical direction, and the top surface of the red light quantum dot layer is at a level lower than that of the top surface of the light diffusion layer in the vertical direction.

2. The color filter according to claim 1, wherein the polymer resin substrate is formed by curing one of polydimethylsiloxane, silicone or resin.

3. The color filter according to claim 1, wherein the receiving grooves are formed by nano-imprinting or etching the polymer resin substrate.

4. The color filter according to claim 1, wherein the reflective layer comprises a distributed Bragg reflector.

5. The color filter according to claim 1, wherein the light diffusion layer is formed by mixing and curing a light diffusion powder and a matrix adhesive.

6. The color filter according to claim 5, wherein a weight proportion of the light diffusion powder within the light diffusion layer is 5%-20%.

7. The color filter according to claim 5, wherein the light diffusion powder comprises an organic material and an inorganic material, wherein the organic material comprises one or more of acrylate (PMMA), polystyrene (PS), organic silicone microspheres, and silicon microspheres; and the inorganic material comprises one or more of nano-aluminum oxide, nano-silver, and nano-gold; the matrix adhesive is formed by mixing one or more materials of acrylate adhesive, polyurethane adhesive, and epoxy resin adhesive.

8. A method of manufacturing the color filter according to claim 1, comprising steps of:
depositing a liquid polymer resin on a substrate to form a polymer resin base after thermal curing or ultraviolet curing, followed by forming a plurality of receiving grooves recessed with respect to a top surface of polymer resin substrate and arranged at intervals by nano-imprinting or etching the polymer resin substrate; wherein adjacent three of the receiving grooves are respectively a red light groove, a green light groove, and a blue light groove, and the polymer resin substrate comprises the top surface and a bottom surface opposite each other in a vertical direction and extending in a horizontal direction perpendicular to the vertical direction;
disposing a reflective layer on a bottom of the red light groove and a bottom of the green light groove;
coating a mixture of a light diffusion powder and a matrix adhesive on an inner side wall of each of the receiving grooves to form a light diffusion layer by thermal curing, wherein the light diffusion layer comprises a top surface and a bottom surface opposite each other in the vertical direction and extending in the horizontal direction, and the bottom surface of the light diffusion layer is closer to the reflective layer than the top surface of the light diffusion layer; and
filling the green light groove and the red light groove respectively with a green light quantum dot material and a red light quantum dot material by inkjet printing or atomizing spraying on the light diffusion layer, to obtain a quantum dot layer after curing,
wherein the quantum dot layer comprising a green light quantum dot layer and a red light quantum dot layer, wherein the green light quantum dot layer is disposed on the reflective layer inside the green light groove and comprises a bottom surface contacting the reflective layer and a top surface opposite the bottom surface of the green light quantum dot layer in the vertical direction, the red light quantum dot layer is disposed on the reflective layer inside the red light groove and comprises a bottom surface contacting the reflective layer and a top surface opposite the bottom surface of the red light quantum dot layer in the vertical direction, and the bottom surfaces and the top surfaces of the green and red light quantum dot layers extend in the horizontal direction, and
wherein the top surface of the green light quantum dot layer is at a level lower than that of the top surface of the light diffusion layer in the vertical direction, and the top surface of the red light quantum dot layer is at a level lower than that of the top surface of the light diffusion layer in the vertical direction.

9. A full-color micro light-emitting diode device, comprising a color filter,
wherein the color filter, comprising:
a polymer resin substrate, wherein the polymer resin substrate comprises a top surface and a bottom surface opposite each other in a vertical direction and extending in a horizontal direction perpendicular to the vertical direction, and is disposed with a plurality of receiving grooves recessed with respect to the top surface of polymer resin substrate and arranged at intervals, wherein adjacent three of the receiving grooves are respectively a red light groove, a green light groove, and a blue light groove;
a reflective layer disposed on a bottom of the red light groove and a bottom of the green light groove;
a light diffusion layer disposed on an inner side wall of each of the receiving grooves, wherein the light diffusion layer comprises a top surface and a bottom surface opposite each other in the vertical direction and extending in the horizontal direction, and the bottom surface of the light diffusion layer is closer to the reflective layer than the top surface of the light diffusion layer; and
a quantum dot layer comprising a green light quantum dot layer and a red light quantum dot layer, wherein the green light quantum dot layer is disposed on the reflective layer inside the green light groove and comprises a bottom surface contacting the reflective layer and a top surface opposite the bottom surface of the green light quantum dot layer in the vertical direction, the red light quantum dot layer is disposed on the reflective layer inside the red light groove and comprises a bottom surface contacting the reflective layer and a top surface opposite the bottom surface of the red light quantum dot layer in the vertical direction, and the bottom surfaces and the top surfaces of the green and red light quantum dot layers extend in the horizontal direction,
wherein the top surface of the green light quantum dot layer is at a level lower than that of the top surface of the light diffusion layer in the vertical direction, and the top surface of the red light quantum dot layer is at a level lower than that of the top surface of the light diffusion layer in the vertical direction.

10. The full-color micro light-emitting diode device according to claim 9, further comprising:
a blue light back plate attached to one side of the color filter disposed with the receiving groove, wherein a plurality of blue light sources arranged at intervals are disposed on the blue light back plate, each of the blue light sources is respectively disposed corresponding to each of the receiving grooves, and each of the blue light sources is respectively disposed at a notch position of each of the receiving grooves.

11. The color filter according to claim 1, wherein a first empty space within the green light groove is surrounded by the top surface of the green light quantum dot layer and an inner side wall of the light diffusion layer within the green light groove, a second empty space within the red light groove is surrounded by the top surface of the red light quantum dot layer and an inner side wall of the light diffusion layer within the red light groove, and a third empty space within the blue light groove is surrounded by the top surface of the polymer resin substrate and an inner side wall of the light diffusing layer within the blue light groove.

12. The color filter according to claim 1, wherein the light diffusion layer contacts the top surface of the polymer resin substrate at a bottom of the blue light groove.

13. The color filter according to claim 1, wherein a thickness of the quantum dot layer is 450 nm.

* * * * *